United States Patent
Segan et al.

[11] Patent Number: 5,945,850
[45] Date of Patent: Aug. 31, 1999

[54] EDGE SIGNAL RESTORATION CIRCUIT AND METHOD

[75] Inventors: Scott A. Segan, South Whitehall Township; Richard Muscavage, Gilbertsville, both of Pa.

[73] Assignee: Lucent Technologies Inc., Murray Hill, N.J.

[21] Appl. No.: 08/963,063

[22] Filed: Nov. 3, 1997

Related U.S. Application Data

[60] Provisional application No. 60/061,530, Oct. 9, 1997.

[51] Int. Cl.⁶ ...................................................... H03K 5/19
[52] U.S. Cl. ................................ 327/24; 327/20; 327/299
[58] Field of Search ..................................... 327/256, 291, 327/299, 392, 398, 399, 387, 20, 22, 24, 31, 170, 165, 166

[56] References Cited

U.S. PATENT DOCUMENTS

| | | | |
|---|---|---|---|
| 4,071,781 | 1/1978 | Kayalioglu | 327/165 |
| 4,779,013 | 10/1988 | Tanaka | 326/27 |
| 4,973,865 | 11/1990 | Haq | 327/263 |
| 4,982,110 | 1/1991 | Yokogawa et al. | 369/48 |
| 5,018,169 | 5/1991 | Wong et al. | 375/119 |
| 5,168,181 | 12/1992 | Baiocchi et al. | 327/26 |
| 5,359,232 | 10/1994 | Eitrheim | 327/116 |
| 5,604,455 | 2/1997 | Bion et al. | 327/176 |
| 5,623,223 | 4/1997 | Pasqualini | 327/298 |
| 5,708,389 | 1/1998 | Gabara | 327/552 |

*Primary Examiner*—Timothy P. Callahan
*Assistant Examiner*—An T. Luu

[57] ABSTRACT

An edge signal restoration circuit and method to enhance an edge of a signal decreases a rise and fall time of a propagating signal during transitions between logic states. The edge signal restoration circuit includes a first circuit to detect an edge of an input signal and to output a detection signal, and a second circuit to drive a next state of the input signal in response to the detection signal at approximately the same time as the first circuit detects the edge of the input signal. The edge signal restoration method detects a transition of the signal between a current state and a next state, and drives the next state onto the signal during its transition to that next state.

25 Claims, 8 Drawing Sheets

EDGE SIGNAL RESTORATION CIRCUIT AND METHOD

This application claims priority from U.S. provisional application Serial No. 60/061,530, filed on Oct. 9, 1997.

BACKGROUND OF THE INVENTION

1. Field of the Invention

The present invention relates to enhancement of the edges of an electrical signal. More particularly, the present invention relates to a circuit and method for detecting an edge of a digital signal, and driving the next state of the signal based on the detected signal edge to reduce the rise and fall time of the signal.

2. Description of the Related Art

Many factors in today's complicated integrated circuits (ICs) limit their maximum operational speed. For instance, ICs typically have long, interconnected electrical wiring inherently exhibiting significant delays from rise and fall times based on the resistance and capacitance of the electrical wiring. This delay is conventionally known as a time constant, and is calculated by the equation T=RC, where T is time in seconds, R is resistance in ohms, and C is capacitance in farads.

All electrical wiring in ICs has some amount of resistance and some amount of capacitance, although it is generally minimized by designing ICs with the shortest possible routes and maximum isolation from other wiring. Nevertheless, the edges of digital signals have exponentially rising and falling edges. Consequently, the resistance and capacitance in the electrical wiring inside ICs leads directly to significant propagation delays.

FIG. 10A depicts a wiring path 36 in an IC exhibiting propagation delay because of its resistance and capacitance. One conventional solution to improve excessive propagation delay is to place buffers 32 and 34 in series along the wiring route 36a, 36b, as shown in FIG. 10B. In FIG. 10B, an otherwise long wiring route is broken into two parts 36a and 36b, and two inverters forming buffers 32 and 34 are placed serially there between. The breaking of the electrical wiring route 36 as shown in FIG. 10A into two parts 36a, 36b as shown in FIG. 10B increases the overall delay of the signal because a signal must propagate through active buffer components, e.g., at least two metal oxide semiconductor field effect transistors (MOSFETs) 600n, 600p as shown in FIG. 10B. Moreover, because the wiring route 36 is physically cut into two parts 36a, 36b (FIG.10B), a contact resistance is added to the circuit because of contacts with the cut portions. These and other factors increase propagation delays even further.

Thus, there is a need to improve the propagation delays in an electrical wiring route of an IC without adding further delays to the overall device speed.

SUMMARY OF THE INVENTION

In accordance with the principles of the present invention, an edge signal restoration circuit and method to enhance an edge of a signal are provided which decrease the rise and fall time of the signal. The edge signal restoration circuit includes a first circuit to detect an edge of an input signal and to output a detection signal, and a second circuit to drive a next state of the input signal back onto the input signal at approximately the same time as the first circuit detects the edge of the input signal.

A method of edge signal restoration is also provided by detecting a transition of a signal between a current state and a next state. The next state is then driven back onto the signal during its transition.

BRIEF DESCRIPTION OF THE DRAWINGS

Features and advantages of the present invention will become apparent to those skilled in the art from the following description with reference to the drawings, in which:

FIG. 10B shows a conventional electrical wiring route of an IC which is cut to place a buffer there between.

DETAILED DESCRIPTION OF THE ILLUSTRATIVE EMBODIMENTS

Figure 1:
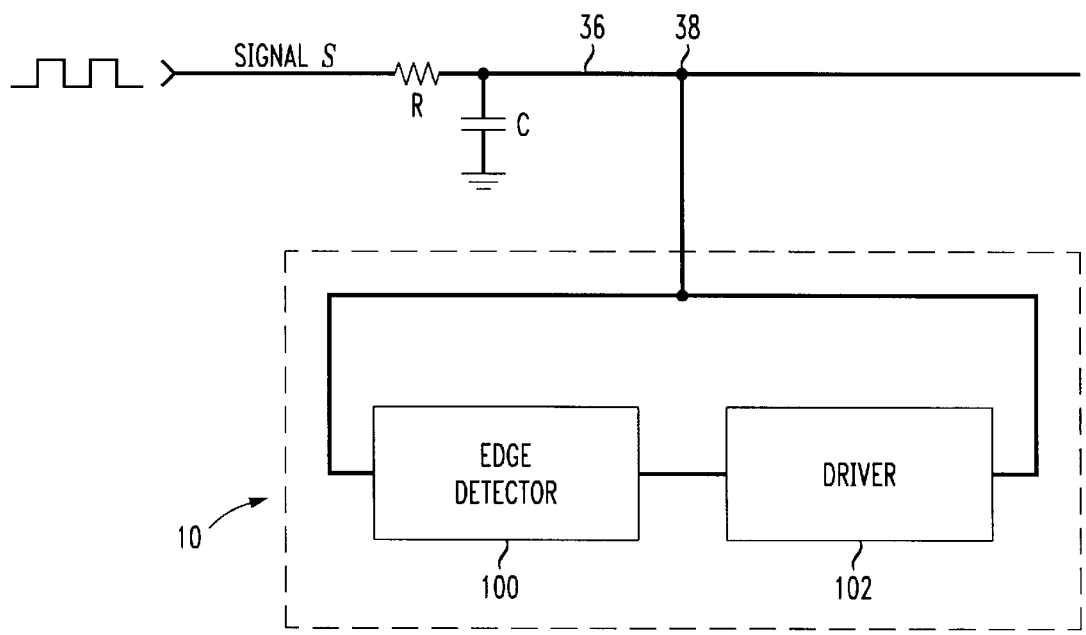
FIG. 1 shows an edge signal restoration (ESR) circuit for a wiring route of an IC according to the present invention.

FIG. 1 shows an edge signal restoration (ESR) circuit 10 connected at only a single electrical node 38 of an unbroken wiring route 36 of an IC. A resistor R represents a resistance of the wiring route 36 and a capacitor C represents the parasitic capacitance of the wiring route 36.

The ESR circuit 10 includes an edge detector 100 to detect a transition period of a signal S either from a logic low state to a logic high state, or from a logic high state to a logic low state at node 38. This transition period corresponds to a rising and falling edge of signal S, respectively. The output of edge detector 100 is fed to driver 102, which drives a next state of signal S back out to node 38 during the transition period. The "next state" of signal S is that logic level which the detected transition of signal S is progressing toward.

Figure 2:
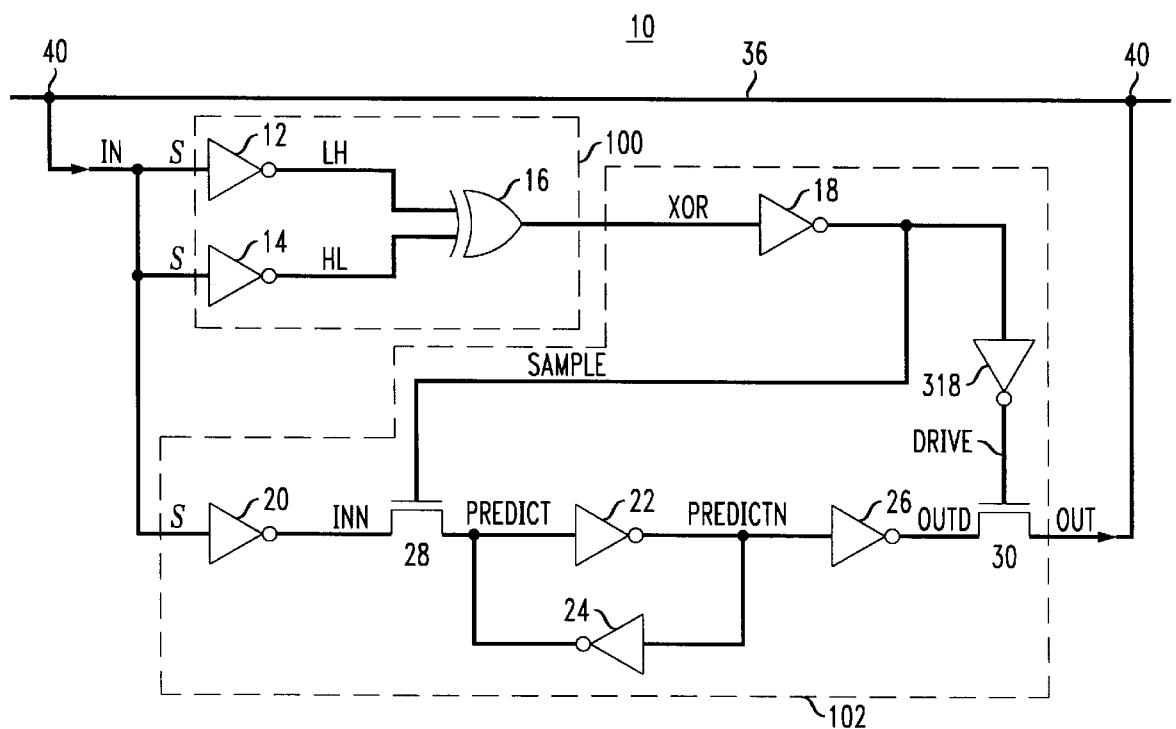
FIG. 2 shows a general configuration of a first embodiment of the ESR circuit according to the present invention.

In FIG. 2, reference numeral 10 designates a general configuration of a first embodiment of the ESR circuit 10. Though FIG. 2 shows that the ESR circuit 10 is connected at two points 40 to an unbroken wiring route 36 of an IC, the ESR circuit 10 is electrically connected at only one electrical node 38 as shown in FIG. 1 because the two points 40 are electrically connected.

In FIG. 2, the edge detector 100 includes inverter 12, inverter 14 and exclusive OR (XOR) gate 16. The driver 102 includes inverters 18, 318, 20, 22, 24, and 26 as well as switches 28 and 30. Inverters 12 and 14 receive an input signal S and output inverted signals LH, HL, respectively. The inverted signals LH, HL output from inverters 12 and 14 are fed into an XOR gate 16. The signal XOR output from XOR 16 is supplied to inverter 18. Inverter 18 inverts the XOR signal and outputs a signal SAMPLE to the gate of MOSFET transistor switch 28. The signal SAMPLE turns switch 28 ON or OFF in accordance with the logic level of the SAMPLE signal. The output of inverter 18 is also supplied to inverter 318 which outputs a signal DRIVE to the gate of MOSFET transistor switch 30. The signal DRIVE turns switch 30 ON or OFF in accordance with the logic level of the DRIVE signal.

An inverter 20 also receives input signal S and outputs an inverted signal INN to the drain of switch 28. The source of switch 28 is connected to the input of inverter 22 and provides signal PREDICT to inverter 22. The output of inverter 22 is connected to the input of inverter 24 and to the input of inverter 26, providing signal PREDICTN. The output of inverter 24 is connected to the input of inverter 22. The output OUTD of inverter 26 is connected to the drain of switch 30.

The power supply is utilized by all logic devices shown in FIG. 2, and is commonly referred to as 'VDD'. VDD is the power supply voltage of the first embodiment of the ESR circuit 10. All inverters in the first embodiment of the ESR circuit 10, except for inverters 12, 14, have conventional CMOS switching points with guaranteed logic levels at approximately ⅓ times the power supply voltage VDD, or (⅓)*VDD, and ⅔ times the power supply voltage VDD, or (⅔)*VDD.

Inverter 12 does not have conventional CMOS switching levels. In one embodiment, the widths of the channels of the CMOS transistors forming inverter 12 are modified to provide an ON/OFF switching point of about 0.3*VDD. When an input voltage to inverter 12 is less than this lower switching point, inverter 12 outputs a logic 1, and when an input voltage to inverter 12 is greater than the lower switching point, inverter 12 outputs a logic 0.

Similarly, inverter 14 does not have conventional CMOS switching levels. The widths of the channels of the CMOS transistors forming inverter 14 are modified to provide an ON/OFF switching point of about 0.7*VDD. When an input voltage to inverter 14 is less than this higher switching point, inverter 14 outputs a logic 1, and when an input voltage to inverter 14 is greater than the higher switching point, inverter 14 outputs a logic 0.

Figure 3:
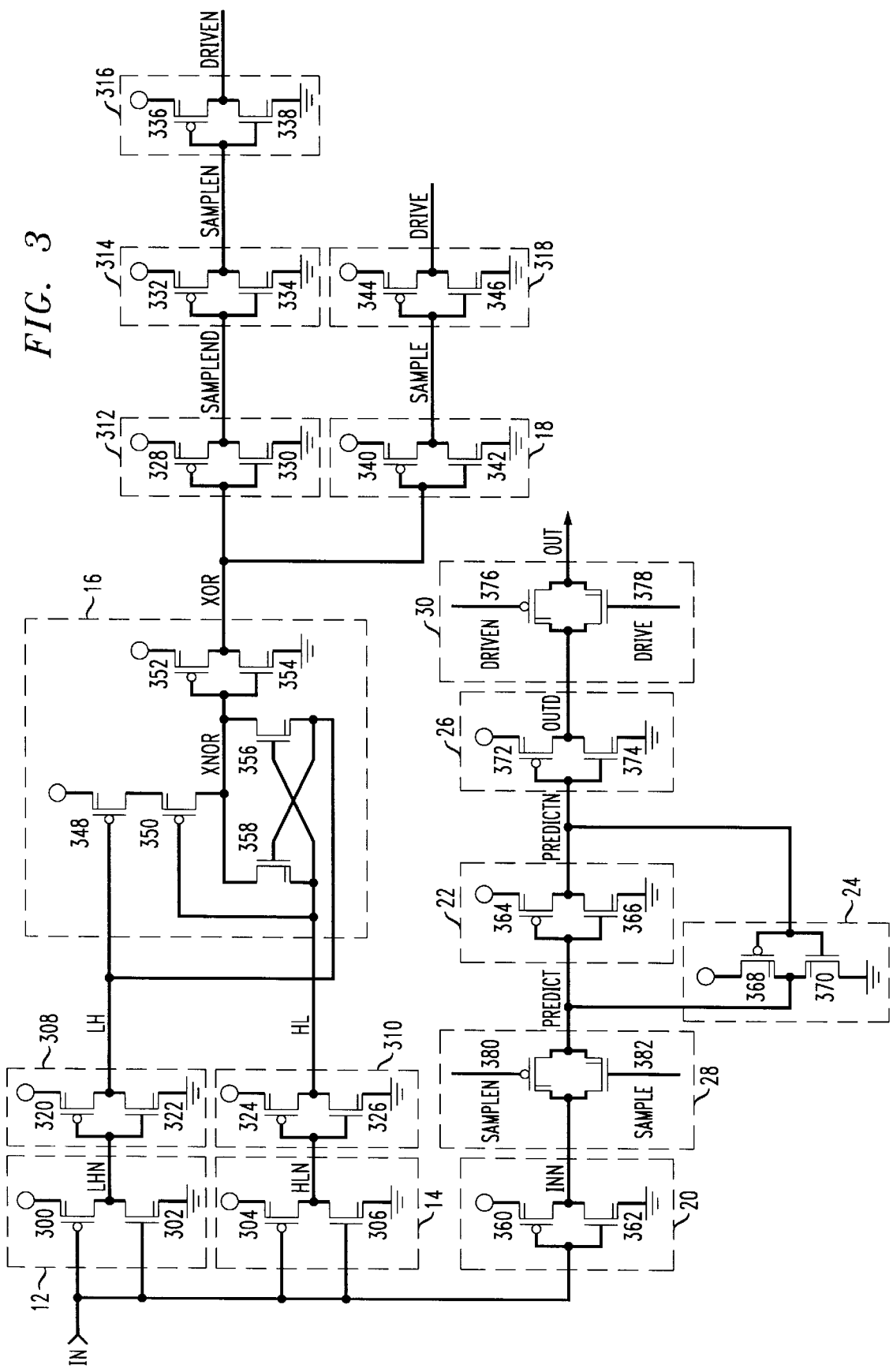
FIG. 3 is a more detailed circuit diagram of the first embodiment shown in FIG. 2.

Referring to FIG. 3, which shows the ESR circuit 10 of the present invention in greater detail, each inverter 12, 14 includes a PMOS transistor 300,304 and an NMOS transistor 302, 306, respectively. Inverters 12 and 14 and XOR 16 detect the rising and falling edges of the signal S at different points. In detecting the rising and falling edges, inverter 12 is designed to have a lower switching point of, for example, about 0.3*VDD and inverter 14 is designed to have a higher switching point of, for example, about 0.7*VDD. This is achieved by adjusting the gate length to width ratios of the PMOS transistors 300, 304 and NMOS transistors 302,306 of the inverters 12 and 14, respectively. For example, if the gates of the PMOS transistors 300,304 are wider than the gates of the NMOS transistors 302,306 within the respective inverter 12,14, then the transition from logic 0 to logic 1 is faster than if the gate widths were to be formed equal. If the gates of the PMOS transistors 300, 304 are narrower than the gates of the respective NMOS transistors 302,306, then the transition from logic 0 to logic 1 is slower than if the gate widths were to formed equal.

Inverter 12 is designed to have a PMOS transistor 300 having a gate width which is six times the gate width of the NMOS transistor 302 gate width to obtain a logic transition switching point of, for example, about 0.3*VDD. The inverter 14 is designed to include a PMOS transistor 304 having a gate width which is twice the width of the gate of the NMOS transistor 306 to obtain a logic transition switching point of, for example, about 0.7*VDD. VDD may be 5V, 3.3V or other suitable power supply voltage. The components of the ESR circuit 10 can be scaled to any suitable power supply voltage.

The two example switching points of 0.3*VDD and 0.7*VDD were chosen based on a CMOS load. However, the two switching points may be chosen to be anywhere between 0 and VDD to detect the rising and falling edge of the signal, with due consideration given to compensate for the switching thresholds of the load at the end of the wiring route. For example, two switching points of 0.2*VDD and 0.36*VDD, respectively, may be chosen hen using the ESR circuit with TTL logic.

In operation, ESR circuit 10 has two modes, namely, a drive mode and a sample mode. The drive mode occurs either during a rising edge of a digital signal S propagating along electrical wiring route 36 or during a falling edge of the digital signal S. A rising edge corresponds to a transition from logic state 0 (low) to logic state 1 (high), and a falling edge corresponds to a transition from logic state 1 to logic state 0. The drive mode reduces the rising or falling time of the signal S while it is in transition between logic states, and thus enhances the edges of the signal S by making the edges of signal S more vertical. The sample mode occurs when the ESR circuit 10 is not in the drive mode, but rather is sampling the achieved logic level of the digital signal on electrical wiring route 36 for use in predicting the next state of the signal S during a transition from that achieved logic level. In the sample mode, the signal S is not yet in transition, i.e., it remains at logic state 0 or logic state 1.

Figure 4:
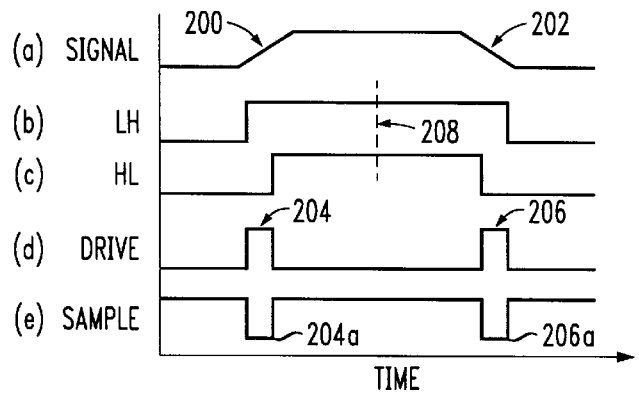
FIG. 4 shows a timing diagram for the first embodiment of FIG. 2.

FIG. 4 shows a timing diagram of the first embodiment of the ESR circuit shown in FIG. 2. A signal S propagating on electrical wiring route 36 is represented as waveform (a) of FIG. 4. The signal S is shown as having linear rising and falling edges for simplicity. However, the rising and falling edges of signal S are actually non-linear, and may be exponential. At the first signal edge 200, i.e., the point at which signal S transitions from logic 0 to logic 1, the output of inverter 12 (i.e., signal LH shown in waveform (b) of FIG. 4) switches logic states before the output of inverter 14 (i.e., signal HL shown in waveform (c) of FIG. 4). This is because of the different switching points of inverters 12 and 14. Conversely, at the second signal edge 202, i.e., the point at which signal S transitions from logic 1 to logic 0, the logic state of the output of inverter 14 switches before the logic state of the output of inverter 12.

Due to the different switching points of inverter 12 and inverter 14, XOR 16 generates pulses 204, 206 between the different switching points of inverters 12, 14 as shown by the signal DRIVE in waveform (d) of FIG. 4. The width of the pulses 204,206 depends on the switching points chosen for inverter 12 and 14, and the length of time it takes inverters 12 and 14 to reach the same logic state.

When inverters 12, 14 are in a state having different output logic levels, then the output of inverter 18 is driven to a logic 0 and the output of inverter 318 is driven to a logic 1. The pulses 204a, 206a of the signal SAMPLE shown in waveform (e) of FIG. 4 turn switch 28 OFF. The pulses 204,206 of the DRIVE signal shown in waveform (d) of FIG. 4 turn switch 30 ON to drive, and thus enhance the predicted logic level of signal S from inverter 26 through switch 30, and back to the electrical wiring route 36.

Once inverters 12 and 14 have the same output logic level at point 208 shown in waveforms (b) and (c) of FIG. 4, then the output of inverter 18 is driven to a logic 1 and the output of inverter 318 is driven to a logic 0, causing switch 28 to turn ON and switch 30 to turn OFF. This causes the storage of the complement of signal S output from inverter 20 in a register formed by inverters 22 and 24. Inverter 26 also stores the complement value of signal S and increases the drive of the stored signal to predict the next logic state of signal S. The complemented logic level output from inverter 26 is driven back onto electrical wiring route 36 to enhance signal S when switch 30 turns ON during the drive mode.

Figure 5:
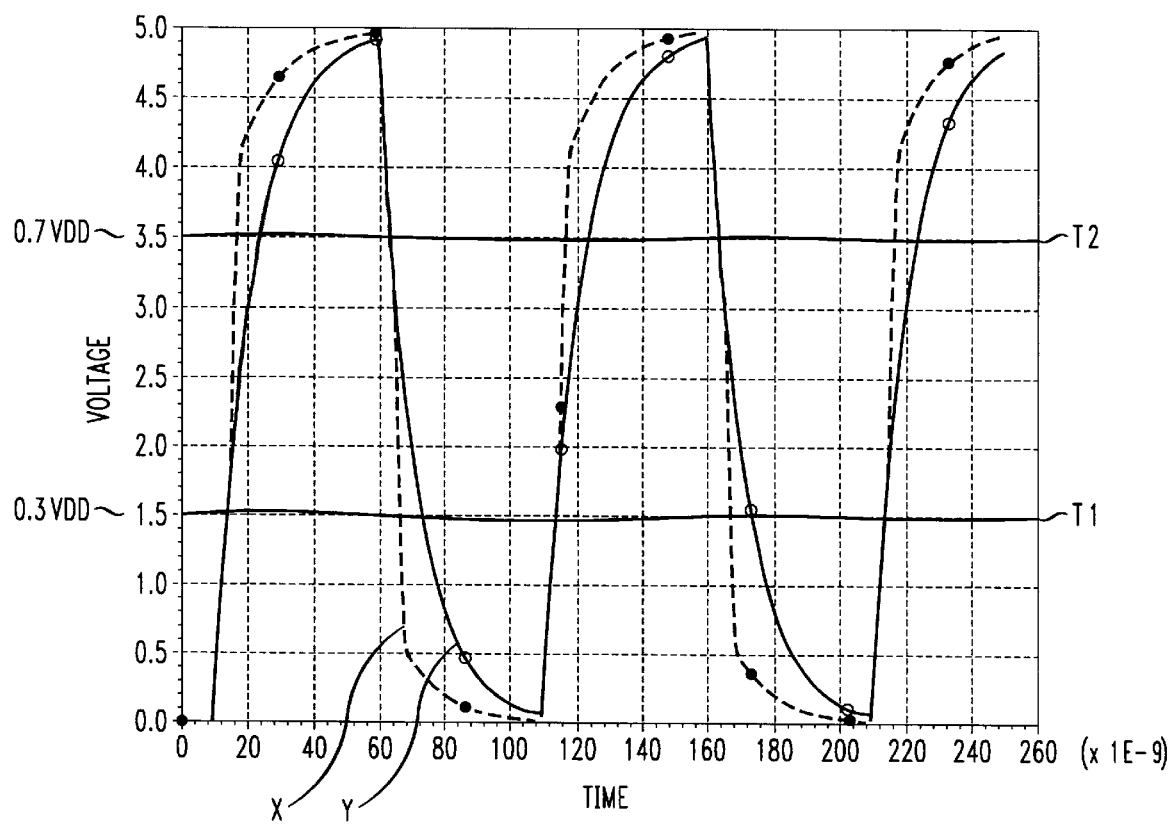
FIG. 5 is a diagram which shows the enhancement of the edges of a signal as a result of an ESR circuit according to the present invention.
Figure 10A:
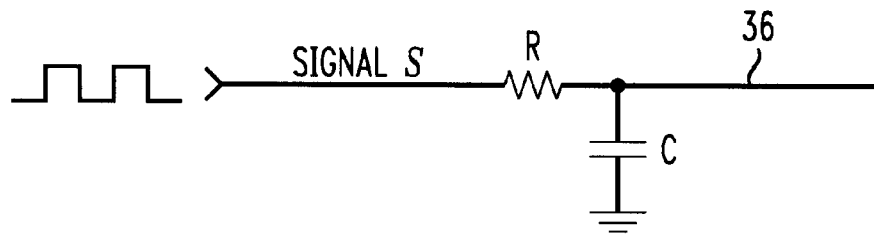
FIG. 10A depicts a conventional electrical wiring route of an IC.
Figure 10B:
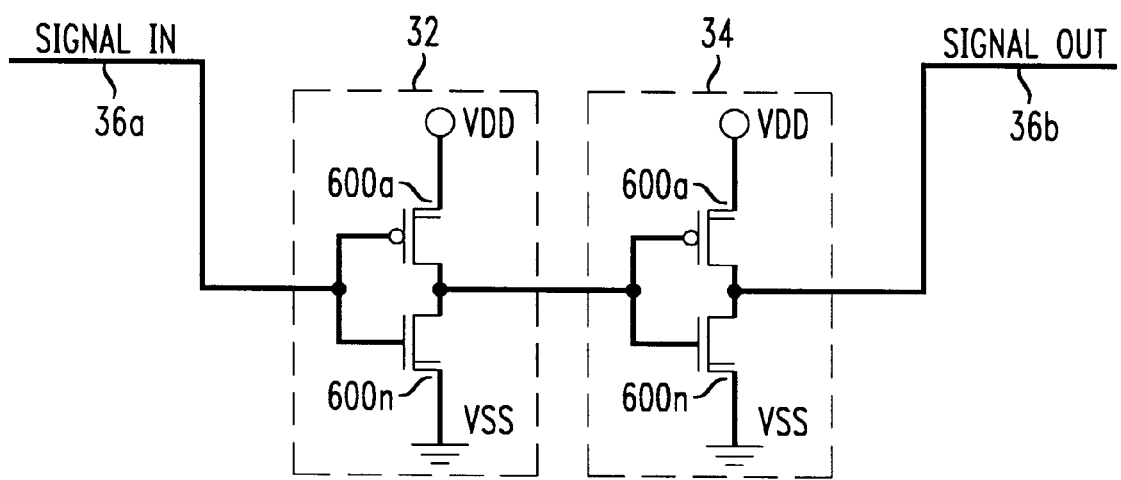

FIG. 5 shows the results of a SPICE simulation comparing the result of the conventional circuit shown in FIG. 10A with that of the circuit of FIG. 1. In FIG. 5, signal X (the dotted line) corresponds to the result of using the circuit of FIG. 1. Signal Y (the solid line) corresponds to a conventional signal without the present invention, i.e., as shown in FIG. 10A. Signal X of the present invention has much sharper edges than signal Y. Signal X also has a decreased rise/fall time and a shorter propagation time than signal Y.

The ESR circuit 10 detects an edge of a signal, i.e., a transition of signal S between the chosen switching points T1 and T2 as shown in FIG. 5, and then drives the predicted next signal. As shown, the switching points T1, T2 are set to about 0.3*VDD and 0.7*VDD, respectively. If the current logic state is logic 0, a transition results in a predicted next logic state of logic 1. If the current logic state is 1, a transition results in a predicted next logic state of logic 0. The present invention detects the occurrence of a transition from a known logic state, and drives signal S to the next logic state faster by driving the predicted next state onto the signal S during its transition to that next level in the transition region between transition points T1 and T2 (see FIG. 5), thereby enhancing the edges of signal S.

As can be seen from FIG. 5, the signal S is driven to the next state at approximately the same time that the rising or falling edge of the signal S is detected. This occurs in the transition region between transition points T1 and T2. As seen from the results shown in FIG. 5, the ESR circuit 10 of the first embodiment with the chosen switching points of 0.3*VDD and 0.7*VDD drives the next state of the signal S at approximately 2V and detects the edge at approximately 1.5. The delay from detecting the rising or falling edge of signal S to driving the next state of signal S is simulated to be about 0.5 nsec. This slight delay is due to the propagation time through the inverters of the ESR circuit 10.

When the ESR circuit 10 stops driving the next state, its output goes to a high impedance state which isolates the driver from the load. FIG. 5 shows that the ESR circuit 10 stops driving the next state at approximately 4.1V. However, this level may vary. For instance, the ESR circuit 10 may be designed to drive until the signal S reaches as high as VDD (or as low as 0V). The points at which the next state is driven are chosen based on the characterization of the load with the objective being to switch the load quickly.

Referring again to FIG. 3, because the switching points of inverters 12 and 14 are modified from those of conventional CMOS inverters, their drive capabilities are reduced. Thus, inverters 308 and 310 follow inverters 12 and 14, respectively, to increase the drive capabilities of inverted signals LH and HL to obtain enough power to drive the XOR 16. Inverter 308 includes a PMOS transistor 320 and an NMOS transistor 322, and inverter 310 includes a PMOS transistor 324 and an NMOS transistor 326. The switching or transition points of inverters 308 and 310 are approximately equal, in accordance with conventional CMOS levels. Though inverters 308 and 310 invert the signals from inverters 12 and 14, this ultimately has no effect due to the logical function of XOR 16.

XOR 16 includes six MOS transistors 348, 350, 352, 354, 356 and 358 in a conventional configuration. Inverter 18 includes a PMOS transistor 340 and an NMOS transistor 342, inverter 318 includes a PMOS transistor 344 and an NMOS transistor 346, inverter 20 includes a PMOS transistor 360 and an NMOS transistor 362, inverter 22 includes a PMOS transistor 364 and an NMOS transistor 366, inverter 24 includes a PMOS transistor 368 and an NMOS transistor 370 and inverter 26 includes a PMOS transistor 372 and an NMOS transistor 374, all in conventional configurations using conventional threshold devices.

Furthermore, switch 28 includes a PMOS transistor 380 to pass a logic 1 signal without any substantial degradation and an NMOS transistor 382 to pass a logic 0 signal without any substantial degradation. Switch 30 includes a PMOS transistor 376 to pass a logic 1 signal without any substantial degradation and an NMOS transistor 378 to pass a logic 0 signal without any substantial degradation. An NMOS transistor has a high resistance to pass a logic 1 signal and a low resistance to pass a logic 0 signal. A PMOS transistor has a high resistance to pass a logic 0 signal and a low resistance to pass a logic 1 signal.

Following the XOR gate 16, inverters 312, 314 and 316 balance the timing with inverter 18 and inverter 318. The signal propagation time through inverter 18 equals that through inverters 312 and 314. Thus, the signal SAMPLEN switches logic states at the same time as the signal SAMPLE. For example, the signal SAMPLE transitions from logic 0 to logic 1 at the same time as signal SAMPLEN transitions from logic 1 to logic 0. The signal SAMPLEN is the complement of signal SAMPLE. Similarly, signal DRIVEN is the complement of the signal DRIVE and the signal DRIVEN switches logic states at the same time as the signal DRIVE. Furthermore, the signal DRIVE switches logic states after the signal SAMPLE such that switch 28 switches before switch 30. Thus, data is first clocked in and then driven out. Inverters 312, 314 and 316, therefore, control the timing of the switches 28 and 30 and also increase the drive capabilities of the signals SAMPLE and DRIVE.

Figure 6:
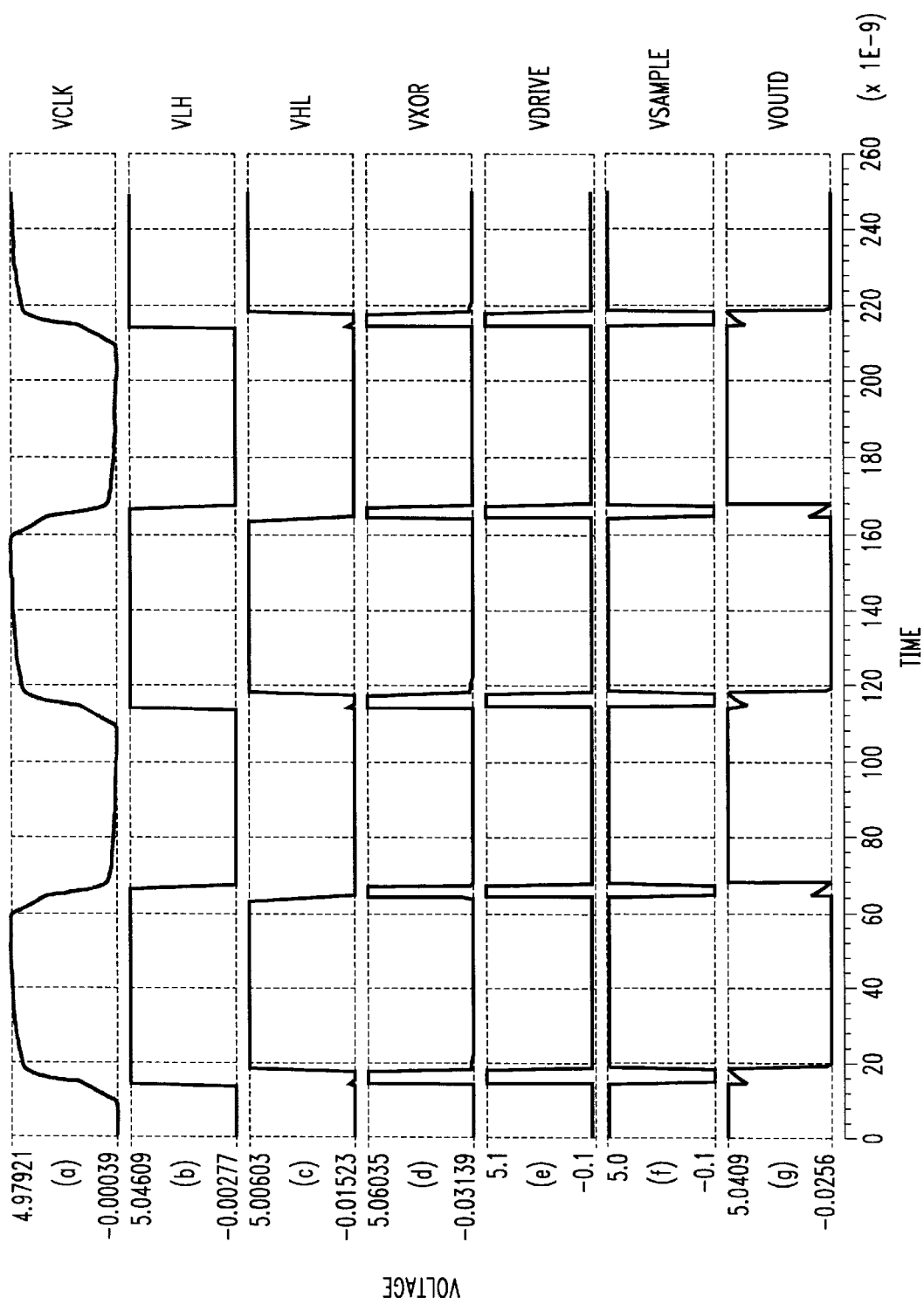
FIG. 6 is a detailed timing diagram for the first embodiment shown in FIG. 2.

FIG. 6 is an actual timing diagram of the ESR circuit 10 in response to a signal S exhibiting a delay T=10 nsec. VCLK in waveform (a) illustrates the voltage of the input square wave signal S at the node 40 of FIG. 2. The input square wave signal S has a frequency of 12 MHZ. VLH in waveform (b) shows the voltage of signal LH shown in FIGS. 2 and 3, VHL in waveform (c) shows the voltage of signal HL shown in FIGS. 2 and 3, and VXOR in waveform (d) shows the voltage of signal XOR shown in FIGS. 2 and 3. VDRIVE in waveform (e) has a slight delay from VXOR in waveform (d), and corresponds to signal DRIVE in FIGS. 2 and 3. VSAMPLE in waveform (f) corresponds to the signal SAMPLE in FIGS. 2 and 3. VOUTD in waveform (g) is the predicted logic state of signal OUTD in FIGS. 2 and 3.

Figure 7:
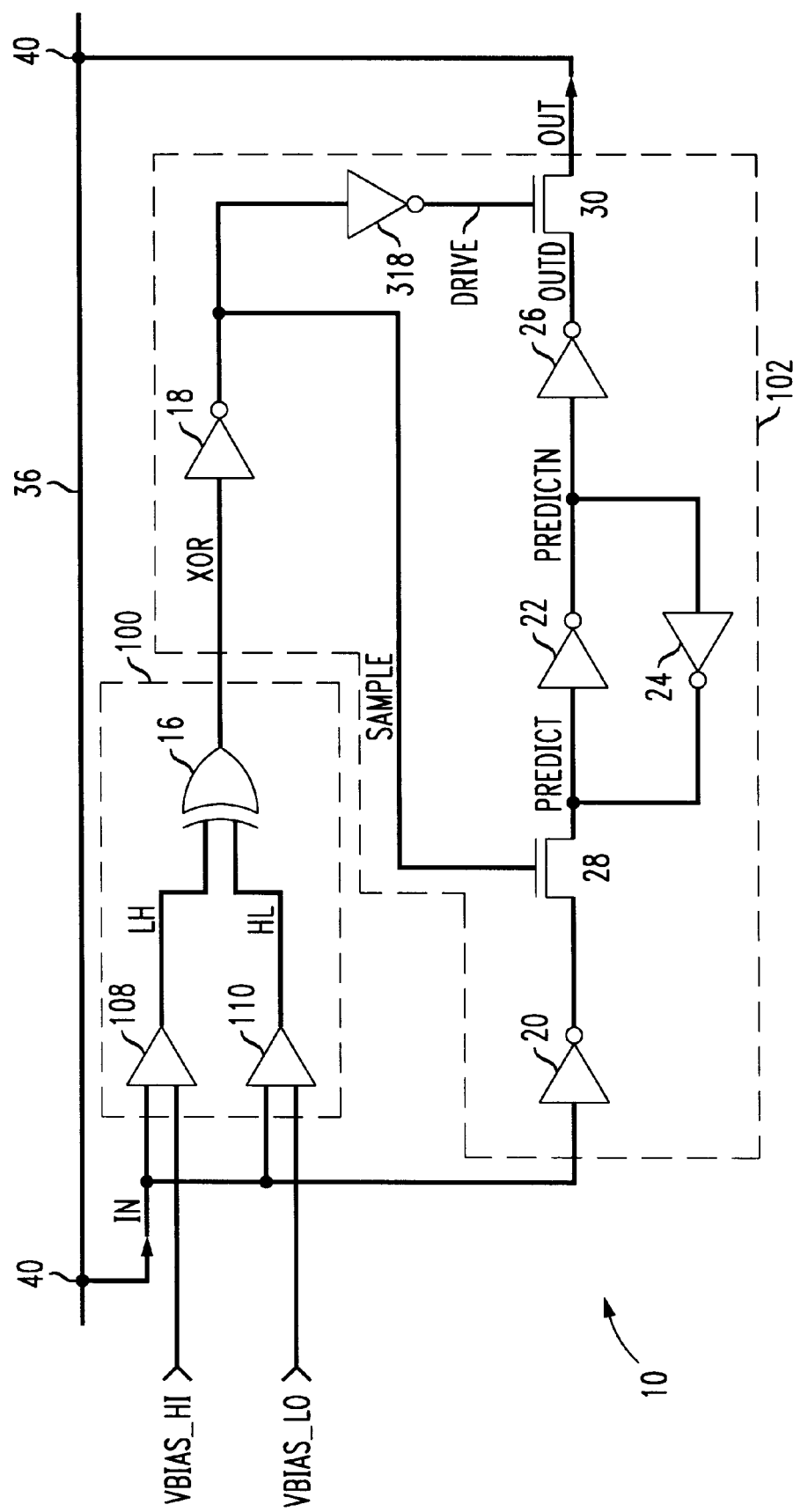
FIG. 7 shows a general configuration of a second embodiment of the ESR circuit according to the present invention.

FIG. 7 shows a second embodiment of the ESR circuit 10. In this embodiment, the edge detector 100 comprises two comparators 108 and 110 which are used to detect an edge or transition period of signal S. The edge detector 100 also includes an XOR gate 16. In this case, each comparator 108, 110 is set with a different switching point by adjusting the bias level of the reference voltage inputs VBIAS_HI, VBIAS_LO. Assuming a CMOS load, the voltage reference VBIAS_HI input to comparator 108 is set to a voltage level equal to the higher switching point, e.g., 0.7*VDD, and the voltage reference VBIAS_LO input to comparator 110 is set to a voltage level equal to the lower switching point, e.g., 0.3*VDD. The driver 102 includes the same components as shown and described with respect to FIG. 2.

Figure 8:
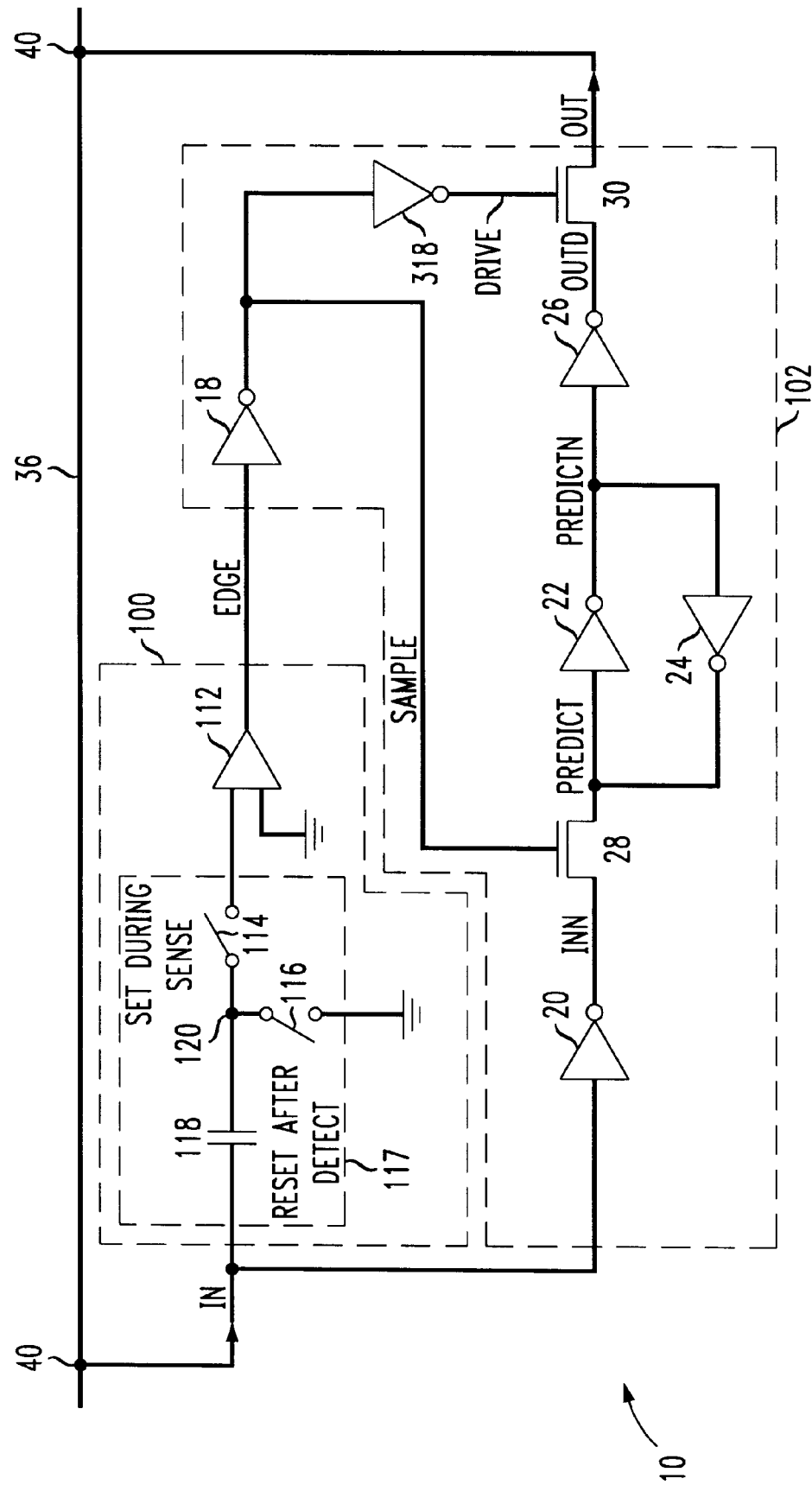
FIG. 8 shows a general configuration of a third embodiment of the ESR circuit according to the present invention.

FIG. 8 shows a third embodiment of the ESR circuit 10. In this embodiment, the edge detector 100 comprises a differentiator 117 and a comparator 112 to detect an edge of signal S. The edge detector 100 includes a differentiator 117 and a comparator 112. The differentiator 117 includes a capacitor 118, a first switch 114 and a second switch 116. In this case, there are no switching points in the edge detector 100. Instead, the differentiator 117 and comparator 112 work together to detect transition of signal S. When the signal S transitions, the capacitor 118 generates a signal (which is a spike) at node 120. This spike signal triggers the switch 114 to close, allowing a voltage to be input to comparator 112. When the voltage input to comparator 112 is greater than ground (i.e., 0 volts) it generates an active EDGE signal to activate the DRIVE signal and deactivate the SAMPLE signal. After the transition is sensed, switch 116 closes to reset the capacitor 118. Switch 114 is open when signal S does not change, and the EDGE signal is not generated by comparator 112. The driver 102 includes the same components as shown in FIG. 2.

Figure 9A:
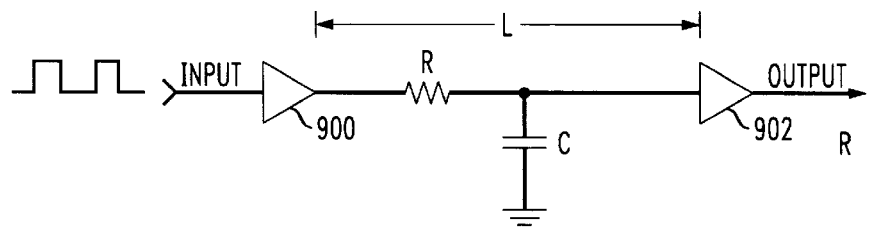
FIG. 9A depicts a conventional wiring route.
Figure 9B:
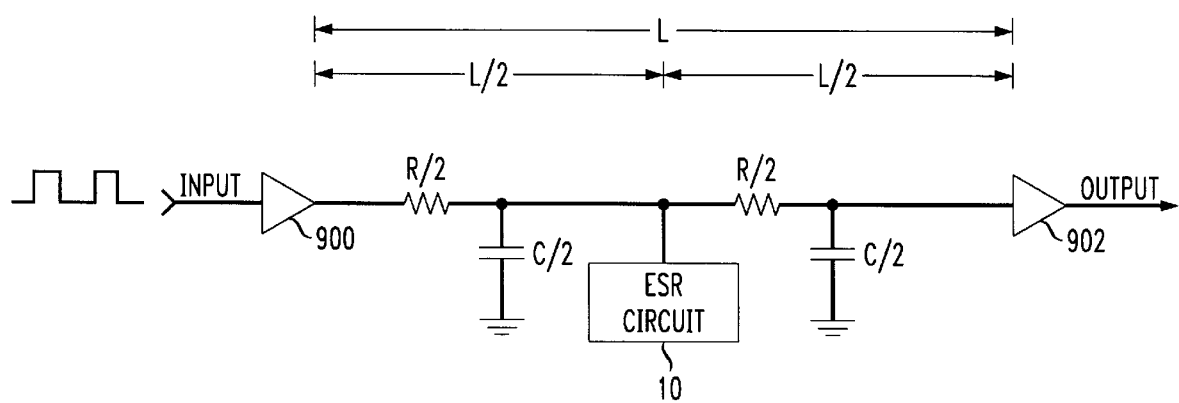
FIG. 9B depicts the placement of an ESR circuit along a wiring route to reduce the propagation delay according to the present invention.

The placement of the ESR circuit 10 with respect to the driver and load affects the RC propagation delay of the signal S propagating along electrical wiring route 36. FIG. 9A shows a signal propagating along a wiring route without the ESR circuit 10. With a distance L from the signal source 900 to the load 902, the delay seen signal S ad is RC. FIG. 9B shows a signal S propagating along a wiring route with the ESR circuit 10. With a distance L from the driver to the load, placing the ESR circuit 10 midway between the driver 900 and the load 902 reduces the delay to that subsequent to the ESR circuit 10. Thus, as shown in FIG. 9B, the propagation delay seen by the load 902 is R/2*C/2=RC/4.

The ESR circuit 10 is small, does not require the wiring route to be broken and does not dissipate static power. The ESR circuit 10 may be used for virtually any digital signal that has a degradation problem. For example, the ESR circuit 10 may be used in a Joint Test Action Group (JTAG) boundary scan chip to reduce the time delay associated therewith. Additionally, the ESR circuit 10 may be used to reduce the clock skew on heavily loaded clocks. The ESR circuit 10 may also be used to decrease RC propagation delay seen by hand-shaking signals used by bus arbitration data transfers.

While the invention has been described with reference to the exemplary preferred embodiments thereof, those skilled in the art will be able to make various modifications to the described embodiments of the invention without departing from the true spirit and scope of the invention.

We claim:

1. An edge signal restoration circuit comprising:
   a first circuit, to detect an edge of an input signal at one electrical node of an electrical wiring route, and to output a detection signal; and
   a second circuit to drive a next state signal from a known state of said input signal back out to said one electrical node, in response to said detection signal, at approximately a same time as said first circuit detects said edge of said input signal.

2. The edge signal restoration circuit according to claim 1, wherein:
   said edge signal restoration circuit connects to an unbroken portion of said electrical wiring route.

3. The edge signal restoration circuit according to claim 1, wherein said first circuit comprises:
   a first component having a first switching point; and
   a second component having a second switching point different from said first switching point;
   wherein said first switching point and said second switching point detect said edge of said input signal at two different points.

4. The edge signal restoration circuit according to claim 3, wherein:
   said first component and said second component are each an inverter.

5. The edge signal restoration circuit according to claim 3, wherein:
   said first switching point is about 0.3 times a power supply voltage of said edge signal restoration circuit; and
   said second switching point is about 0.7 times said power supply voltage.

6. The edge signal restoration circuit according to claim 3, wherein said first circuit further comprises:
   an XOR gate, in communication with said first and second components, to generate said detection signal as a pulse during detection of said edge of said input signal;
   a width of said pulse being based on said first switching point and said second switching point.

7. The edge signal restoration circuit according to claim 1, wherein:
   said second circuit samples said input signal and complements said input signal to generate said next state signal of said input signal.

8. The edge signal restoration circuit according to claim 7, wherein:
   said second circuit latches said complemented input signal.

9. The edge signal restoration circuit according to claim 3, wherein:
   said second circuit drives said next state signal of said input signal only in a transition region between said first switching point and said second switching point.

10. The edge signal restoration circuit according to claim 3, wherein:
    said first component and said second component are each a comparator.

11. The edge signal restoration circuit according to claim 1, wherein:
    said first circuit comprises a differentiator and a comparator.

12. An edge signal restoration circuit comprising:
    a sampler, to sample and complement a present state of an input signal, and to generate a next state signal of said input signal; and
    a driver, to detect at least one of a rising edge and a falling edge of said input signal and, at approximately a same time, to drive said generated next state signal back onto said input signal.

13. The edge signal restoration circuit according to claim 12, wherein:
    said edge signal restoration circuit connects to only one electrical node of an unbroken electrical wiring route.

14. The edge signal restoration circuit according to claim 12, wherein:

said driver has a first switching point and a second switching point different from said first switching point to detect said at least one of said rising edge and said falling edge of said input signal.

15. The edge signal restoration circuit according to claim 14, wherein:

said first switching point is about 0.3 times a power supply voltage of said edge signal restoration circuit; and said second switching point is about 0.7 times said power supply voltage.

16. The edge signal restoration circuit according to claim 12, wherein:

said driver drives said generated next state only in a transition region of said input signal between reaching a first switching point and a second switching point.

17. A method for enhancing an edge of a signal, comprising:

detecting a transition region of an input signal between a present state and a next state; and driving a next state signal back onto said input signal substantially only when said input signal is passing through said transition region.

18. The method for enhancing according to claim 17, wherein said driving comprises:

driving said next state signal onto said input signal at approximately a same time as said detecting said transition region of said input signal.

19. The method for enhancing according to claim 17, wherein said detecting comprises:

detecting said input signal at at least two different switching points.

20. The method for enhancing according to claim 19, wherein said detecting comprises:

setting one of said at least two different switching points to about 0.3 times a power supply voltage.

21. The method for enhancing according to claim 19, wherein said detecting comprises:

setting one of said at least two different switching points to about 0.7 times a power supply voltage.

22. An edge signal restoration circuit comprising:

a first detector to detect a transition of an input signal through a first voltage level;

a second detector to detect a transition of said input signal through a second voltage level different from said first voltage level; and a driver to drive a next logic state from a known state of said input signal based on detection by at least one of said first detector and said second detector back onto said input signal.

23. An edge signal restoration circuit according to claim 22, wherein:

said driver drives said next logic state substantially only during a period of time between a detection of said transition of said input signal by said first detector and a detection of said input signal by said second detector.

24. A method of edge signal restoring for an edge signal restoration circuit, said method comprising:

detecting a transition of an input signal from a first logic state to a second logic state;

predicting a next state from a present state of said input signal; and driving a next state signal back onto said input signal substantially only during a time that said input signal is in transition between said first logic state and said second logic state.

25. The method for edge signal restoring according to claim 24, wherein:

said time that said input signal is in transition is defined by a first time point at which said input signal is equal to about 0.3 times a power supply voltage of said edge restoration circuit, and a second time point at which said input signal is equal to about 0.7 times said power supply voltage.

* * * * *